US006665329B1

(12) United States Patent
Crawford et al.

(10) Patent No.: US 6,665,329 B1
(45) Date of Patent: Dec. 16, 2003

(54) BROADBAND VISIBLE LIGHT SOURCE BASED ON ALLNGAN LIGHT EMITTING DIODES

(75) Inventors: Mary H. Crawford, Tampa, FL (US); Jeffrey S. Nelson, Tampa, FL (US)

(73) Assignee: Sandia Corporation, Albuquerque, NM (US)

( * ) Notice: Subject to any disclaimer, the term of this patent is extended or adjusted under 35 U.S.C. 154(b) by 53 days.

(21) Appl. No.: 10/165,824

(22) Filed: Jun. 6, 2002

(51) Int. Cl.[7] .................. H01S 3/091; H01S 3/094; H01L 29/24
(52) U.S. Cl. .................. 372/75; 257/103
(58) Field of Search .................. 257/13, 17, 97, 257/103; 372/75

(56) References Cited

U.S. PATENT DOCUMENTS

| | | | | | |
|---|---|---|---|---|---|
| 5,146,465 | A | * | 9/1992 | Khan et al. .................. 372/45 |
| 5,759,634 | A | * | 6/1998 | Zang .................. 427/446 |
| 5,897,945 | A | * | 4/1999 | Lieber et al. .................. 428/323 |
| 5,990,496 | A | * | 11/1999 | Kunisato et al. .................. 257/94 |
| 6,046,464 | A | * | 4/2000 | Schetzina .................. 257/96 |
| 6,069,367 | A | * | 5/2000 | Tomiya et al. .................. 257/22 |
| 6,081,001 | A | * | 6/2000 | Funato et al. .................. 257/94 |
| 6,114,620 | A | * | 9/2000 | Zuppero et al. .................. 136/253 |
| 6,117,700 | A | * | 9/2000 | Orita et al. .................. 438/46 |
| 6,169,294 | B1 | * | 1/2001 | Biing-Jye et al. .................. 257/79 |
| 6,222,116 | B1 | * | 4/2001 | Zuppero et al. .................. 136/253 |
| 6,239,033 | B1 | * | 5/2001 | Kawai .................. 438/693 |
| 6,242,764 | B1 | * | 6/2001 | Ohba et al. .................. 257/190 |
| 6,281,032 | B1 | * | 8/2001 | Matsuda et al. .................. 438/42 |
| 6,337,117 | B1 | * | 1/2002 | Maenosono et al. .................. 428/64.1 |
| 6,337,493 | B1 | * | 1/2002 | Tanizawa et al. .................. 257/79 |
| 6,337,536 | B1 | * | 1/2002 | Matsubara et al. .................. 313/498 |
| 6,426,513 | B1 | * | 7/2002 | Bawendi et al. .................. 257/13 |
| 6,465,953 | B1 | * | 10/2002 | Duggal .................. 313/553 |
| 6,495,324 | B1 | * | 12/2002 | Mirkin et al. .................. 435/6 |
| 6,500,689 | B2 | * | 12/2002 | Uemura et al. .................. 438/46 |
| 2001/0033135 | A1 | * | 10/2001 | Duggal et al. .................. 313/506 |

OTHER PUBLICATIONS

S.–C. Lee, K.–R Lee, K.–H. Lee, J.–G Lee and Nong M. Hwang, Computational Nanoscience and Nanotechnology 2002, www.cr.org ISBN 0–970825–6–3.*
Han, J., et al., "AlGaN/GaN quantum well ultraviolet light emitting diodes," Applied Physics Letters, vol. 73, No. 12, Sep. 21, 1998, pp. 1688–1690.
Wilcoxon, et al.., "Synthesis and optical properties of $MoS_2$ and isomorphous nanoclusters in the quantum confinement regime," J. Appl. Phys. 81 (12), Jun. 15, 1997, pp. 7934–7944.
Mukai, T., et al., "High–power UV in GaN/AlGaN double–heterostructure LEDs," Journal of Crystal Growth, 189 190 (1998), pp. 778–781.
Sakhorov, et al., "Heterostructure for UV LEDs Based on Thick AlGaN Layers," MRS Internet Journal of Nitride Semiconductor Research, vol. 3, Article 28, Sep. 28, 1998, pp. 1–7.

* cited by examiner

*Primary Examiner*—Paul Ip
*Assistant Examiner*—Phillip Nguyen

(57) ABSTRACT

A visible light source device is described based on a light emitting diode and a nanocluster-based film. The light emitting diode utilizes a semiconductor quantum well structure between n-type and p-type semiconductor materials on the top surface a substrate such as sapphire. The nanocluster-based film is deposited on the bottom surface of the substrate and can be derived from a solution of $MoS_2$, $MoSe_2$, $WS_2$, and $WSe_2$ particles of size greater than approximately 2 nm in diameter and less than approximately 15 nm in diameter, having an absorption wavelength greater than approximately 300 nm and less than approximately 650 nm.

19 Claims, 7 Drawing Sheets

BROADBAND VISIBLE LIGHT SOURCE BASED ON ALLNGAN LIGHT EMITTING DIODES

This invention was made with Government support under Contract No. DE-AC04-94AL85000 awarded by the Department of Energy. The Government has certain rights in the invention.

BACKGROUND OF THE INVENTION

The invention relates to visible light sources and, more particularly, to visible light sources based on AlInGaN light emitting diodes using nanocluster materials.

Solid-state light sources spanning the visible wavelength spectrum with low-power consumption and long life have uses in a number of display and illumination applications. Presently, no one materials system can be used to efficiently generate light over the entire visible energy spectrum. Light emitting diode (LED) devices have been constructed using p-doped and n-doped materials, but are generally only capable of emitting color of a narrow range of wavelengths based on the semiconductor materials used in the diode. These devices typically employ either AlInGaN or AlInGaP semiconductor materials.

AlInGaN-based LEDs can be fabricated over the green, blue and ultraviolet regions, with yellow and red wavelengths possible with very low efficiencies. LEDs fabricated from AlGaInP materials emit from the red to near-green region and AlGaAs LEDs in the deep red region. Because different material systems are necessary for a full-color (RGB) display, complex electronics modules are required to precisely control the current and voltage requirements of each material. Similarly, the generation of broadband white light is also difficult.

Light emitting devices have also been made using polymeric materials as a hole transport layer between a hole injection electrode and an electron injection electrode. Such devices, such as those using poly-(p-phenylene vinylene, are also limited to emission of a narrow range of wavelengths based on the polymeric material used. To vary the color, different polymeric materials must be used, complicating the display of light of various colors.

Because LEDs typically do not emit over a broad range of wavelengths, a number of schemes have been proposed and subsequently demonstrated to enable broadband emission with an ultimate goal of achieving a high efficiency semiconductor-based white light source. AlGaInN-based LEDs emitting in the blue (450–470 nm) region of the spectrum have been integrated with yellow phosphor materials (for example, yttrium-aluminum-garnet phosphors) to produce white light and these LEDs are available commercially. Generally speaking, these white LEDs have poor color characteristics due to having merely two color components and have color rendering index (CRI) values that can vary with injected current, temperature and angle of view. Similarly, blue LEDs have been integrated with polymer materials as well as passive AlInGaP semiconductor layers to form a two component white light source.

DESCRIPTION OF SPECIFIC EMBODIMENTS

The present invention comprises a visible light source device based on a light emitting diode and utilizing a nanocluster-based film. The visible light source device is based on a single GaN-based LED combined with a coating of nanocluster materials having strong absorption in the ultraviolet wavelength range and strong emission in the visible wavelength range.

The present invention integrates an AlInGaN ultraviolet emitting LED with highly efficient and tailorable nanocluster materials. As described herein, these nanocluster materials have many of the advantageous properties of phosphors and polymers, such as ease of manufacturing, deposition and patterning capability. They further display controllable quantum confinement effects where the size of the clusters can significantly change the absorption and emission properties of the material. This size dependent effect enables the absorption properties to be optimized for particular ultraviolet excitation wavelengths and emission properties to be optimized for a number of lighting applications.

Figure 1:
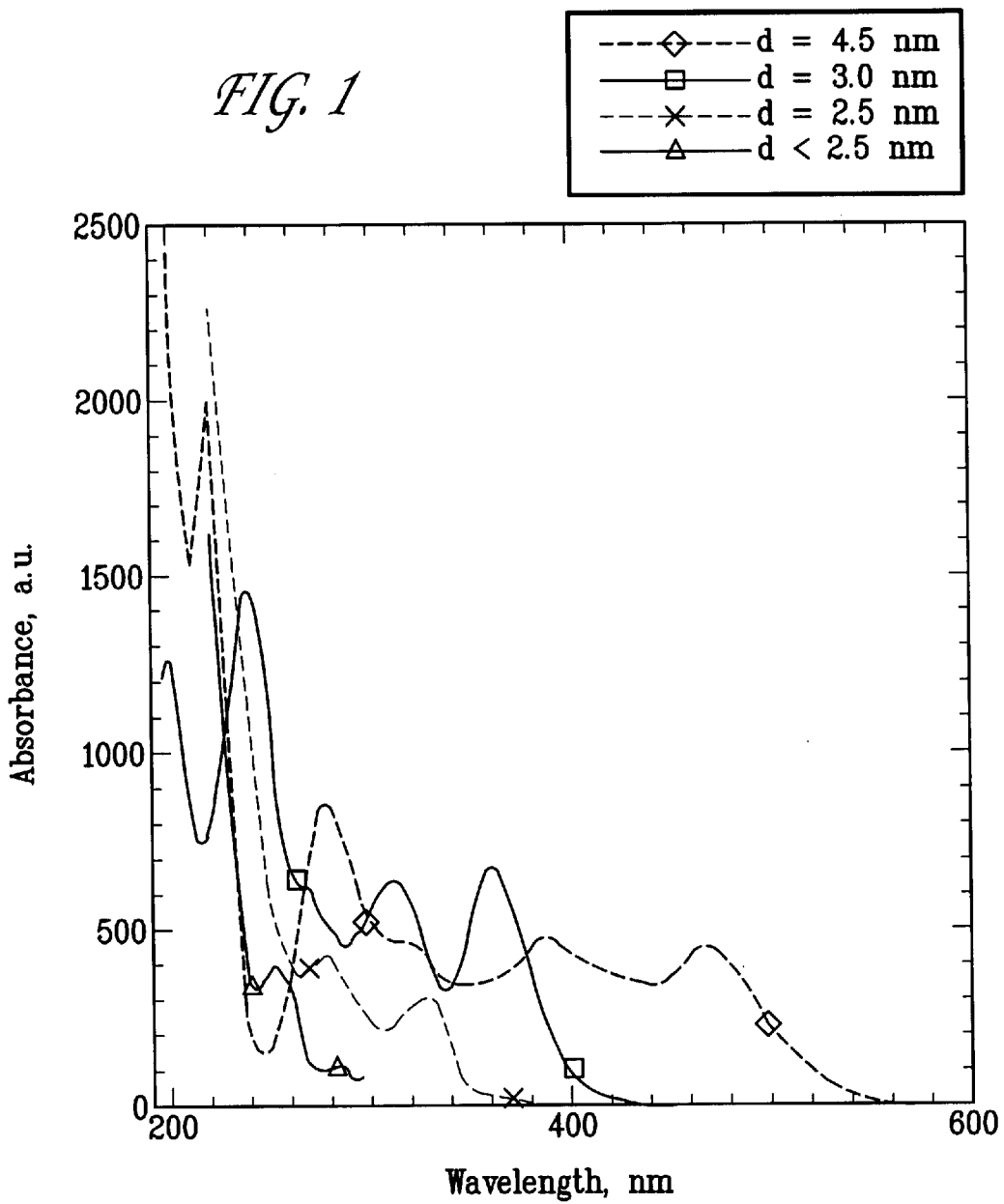
FIG. 1 shows the absorbance characteristics of $MoS_2$ nanocluster materials of different diameters.
Figure 2:
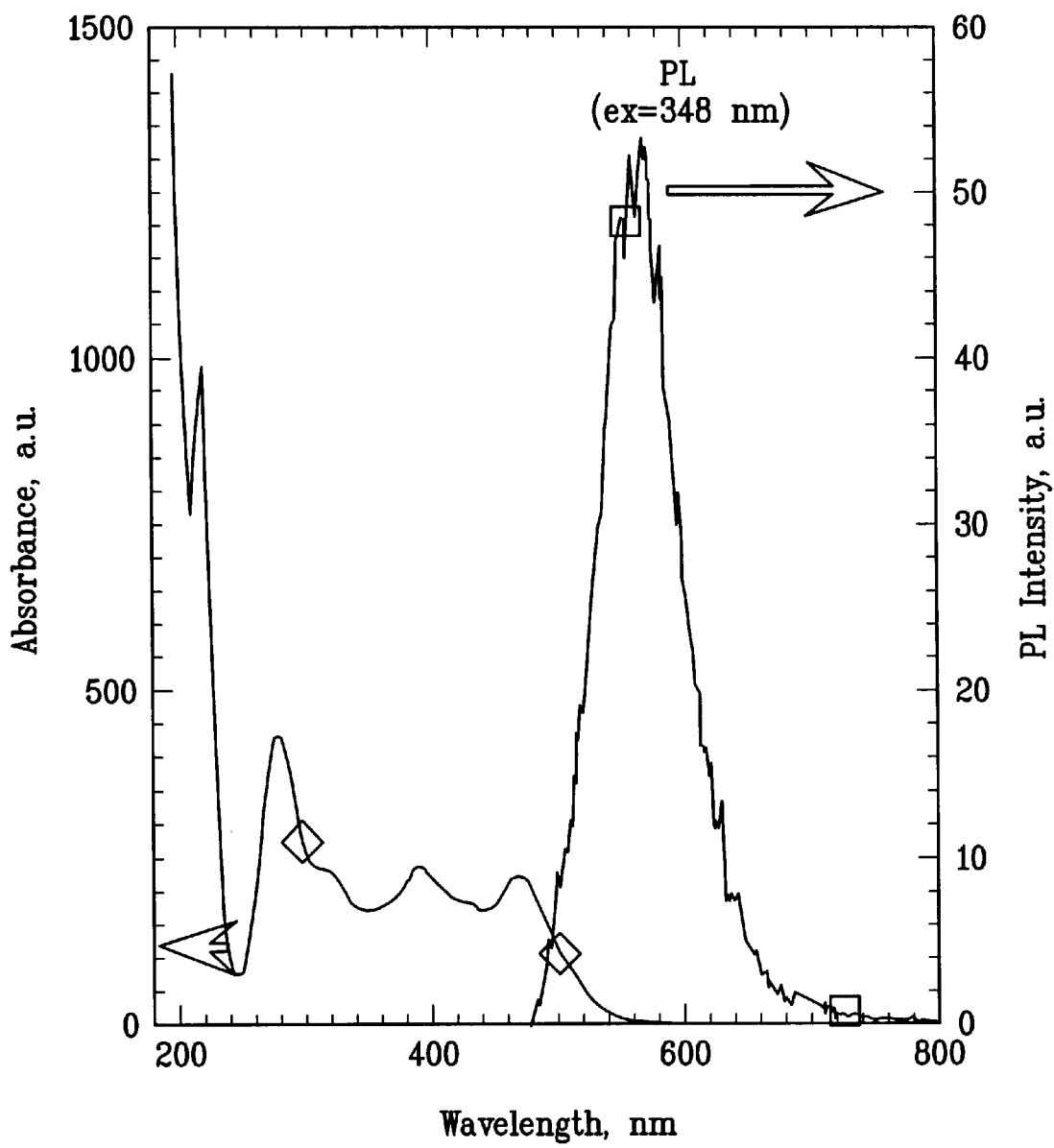
FIG. 2 shows the absorption spectra of 4.5 nm $MoS_2$ nanoclusters excited at 348 nm.
Figure 3:
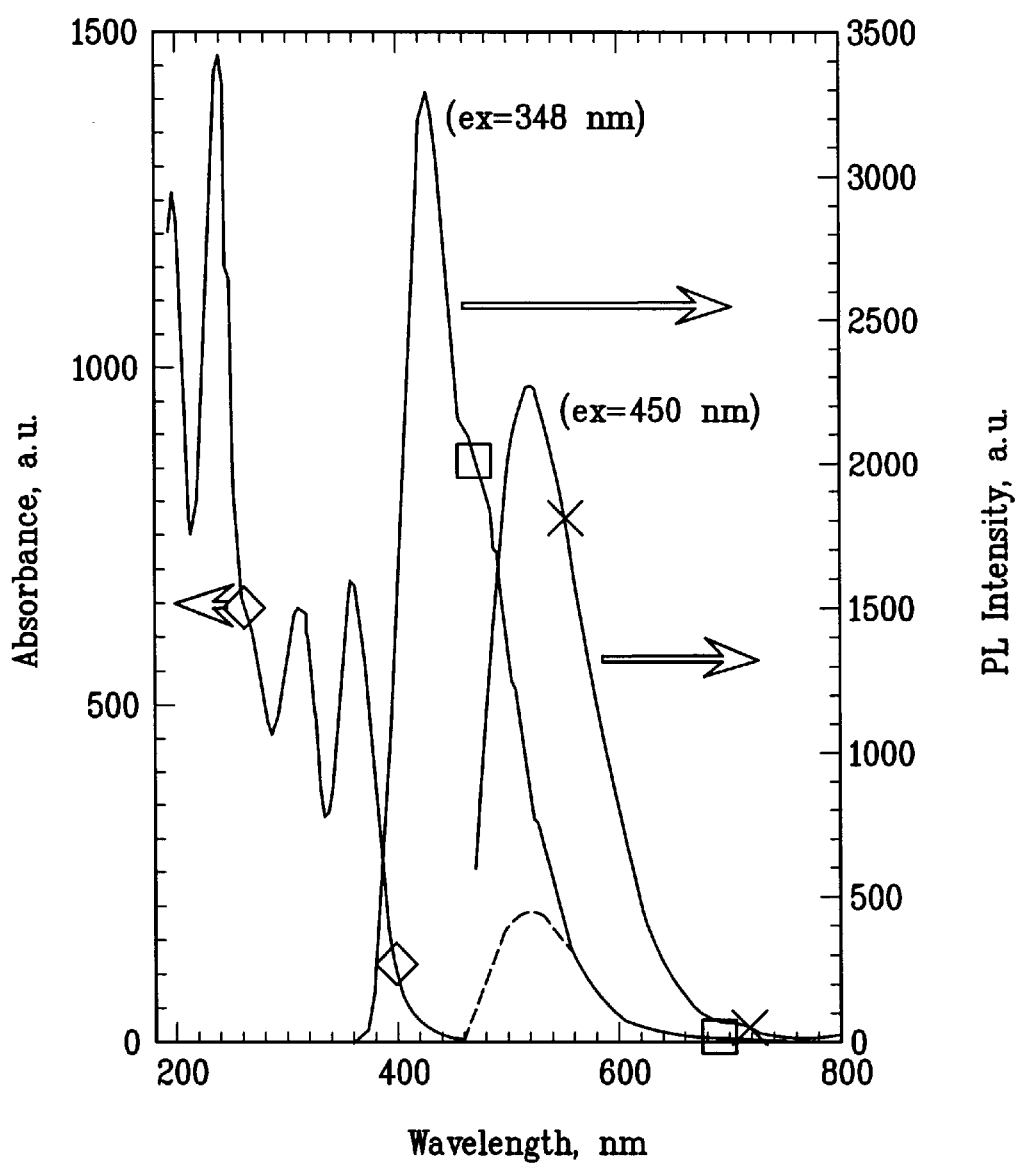
FIG. 3 shows optical absorption of 3.0 nm $MoS_2$ nanoclusters at excitation wavelengths of 450 and 348 nm.
Figure 4:
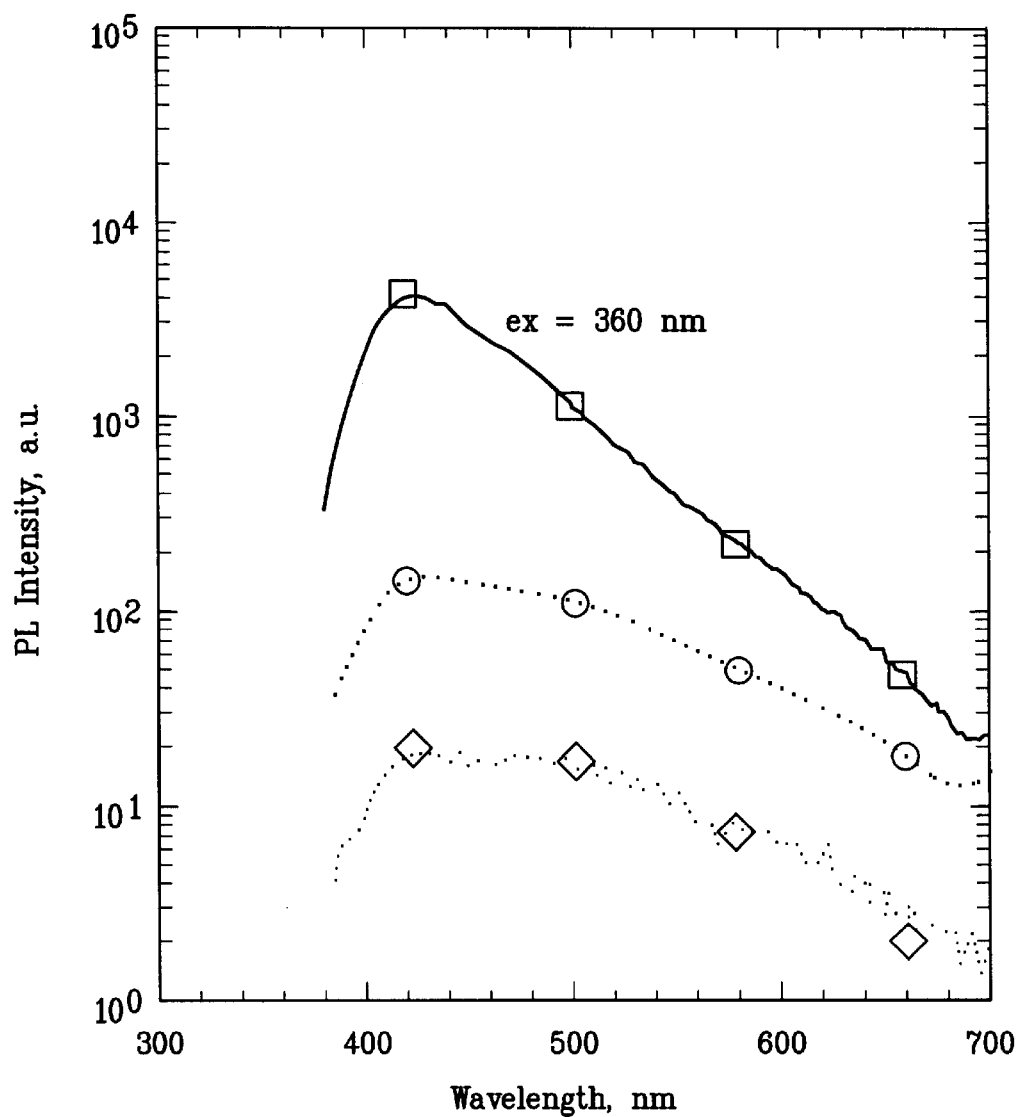
FIG. 4 shows effect of adding a gold coating to 3.0 nm $MoS_2$ nanoclusters.
Figure 5:
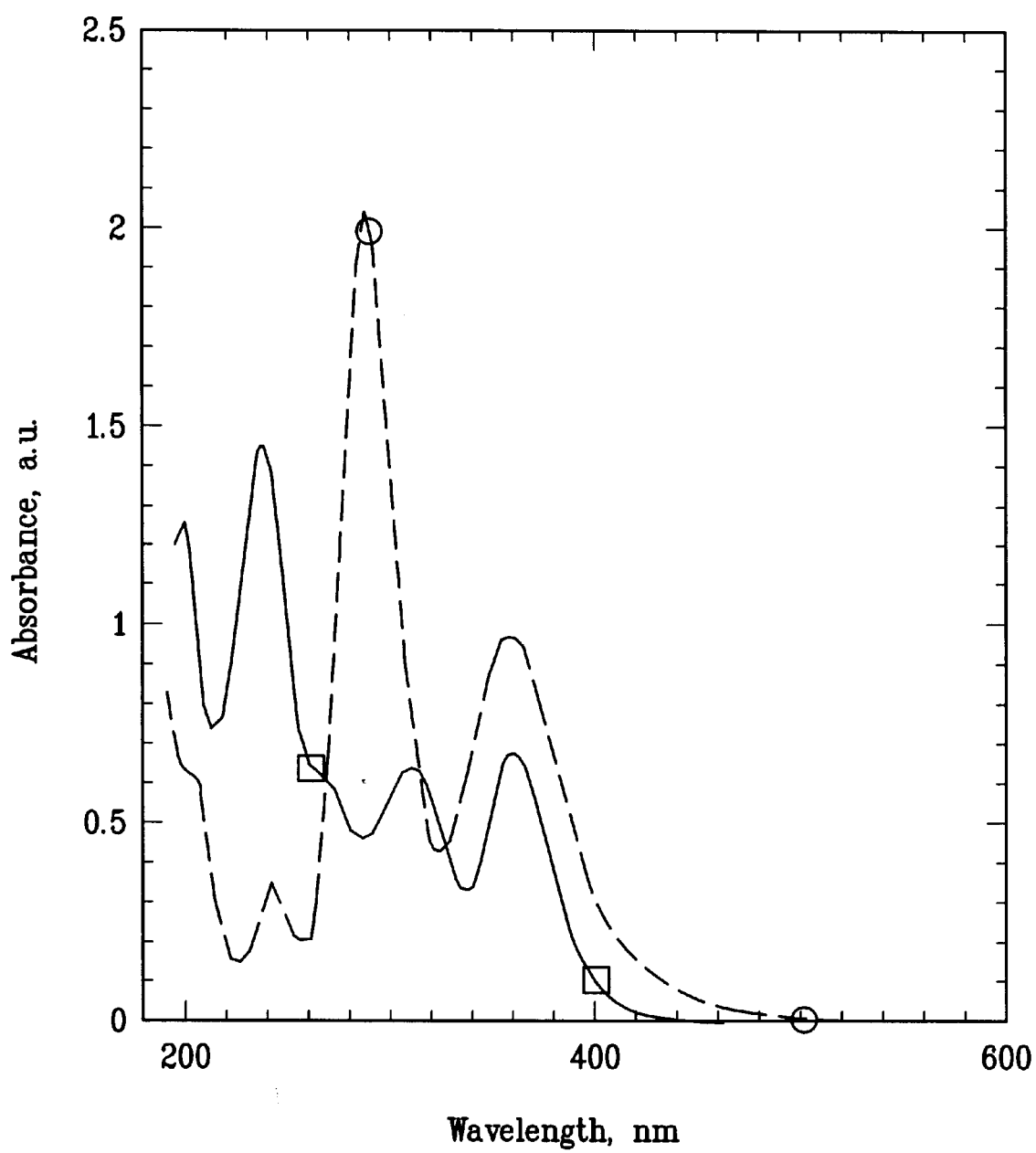
FIG. 5 shows a comparison of the optical absorption spectra of 3.0 nm $WS_2$ and $MoS_2$ nanoclusters.

Nanocluster materials have been shown to have optical properties that can be controlled during the synthesis technique where varying the nanocluster material and particle size distribution affects the optical light absorption and emission properties. For example, using $MoS_2$ nanoclusters with a radius of approximately 4.5 nm have an absorption edge at about 550 nm while $MoS_2$ nanoclusters with a radius of approximately 2.5 nm have an absorption edge at about 300 nm (see FIG. 1). The cluster size, along with the excitation wavelength, also affects the emission spectra. $MoS_2$ nanoclusters with a radius of approximately 4.5 nm have broad emission (see FIG. 2) from about 500 nm (green) to 650 nm (red). By changing the $MoS_2$ nanocluster size from 4.5 nm to 3.0 nm, the emission ranges from 400 nm (blue) to 600 nm (orange), as shown in FIG. 3. Furthermore, by blending the $MoS_2$ nanoclusters over a range of sizes (3–5 nm), a broadband white source can be obtained. When Au is added to $MoS_2$ nanoclusters, the emission intensity and distribution can be changed (see FIG. 4). The use of $WS_2$ nanoclusters of radius 3.0 nm, compared with $MoS_2$ nanoclusters of the same radius, also alters the optical absorption properties (see FIG. 5).

The nanocluster materials are formed inside inverse micellar cages in nonaqueous solvents, as described by Wilcoxon et al. (J. Wilcoxon, P. Newcomer, and G. Samara, J. Appl. Phys. 81, 12, 1997, 7934–7943; incorporated herein by reference). $MoS_2$, $MoSe_2$, $WS_2$, and $WSe_2$ were all prepared using a similar approach. In general, the nanocluster materials are formed by first dissolving a metal salt, such as molybdenum halide salt, in a nonaqueous solvent and then combining the solution with another inverse micellar solution containing a sulfiding agent, such as metal sulfide or hydrogen disulfide). With oxygen and water levels kept below 1 ppm during the reaction, clear suspensions of nanoclusters ranging in size from approximately less than 2 nm in diameter to approximately 15 nm in diameter were prepared. The cluster size can be varied by using different sized micellar cages to encapsulate the metal salt. The cluster suspensions are homogeneous, stable and transparent dispersions of the nanocluster material in a nonpolar solvent. The formed solution of nanocluster materials can be formed as a film, generally with a thickness less than a micron, using standard techniques, such as evaporation or spray coating, and used in conjunction with LED devices to produce the visible light source device of the present invention. It should be noted that a wide range of materials, including group II–VI semiconductors (CdS, CdSe, ZnS, ZnSe), can also be fabricated into nanoclusters that are applicable to the proposed broadband light emitter design.

Figure 6:
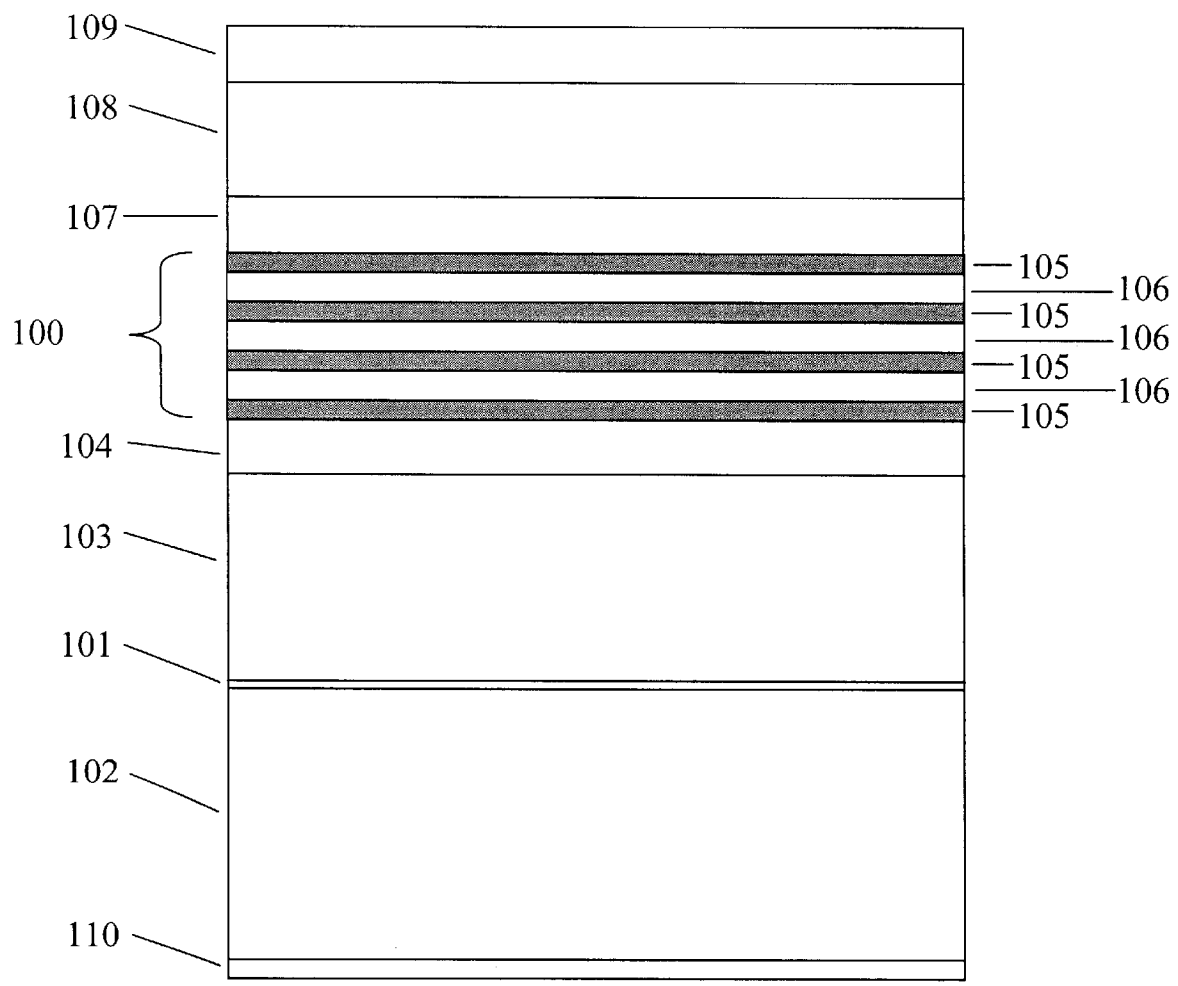
FIG. 6 shows a schematic of the visible light source device of the present invention.

FIG. 6 shows a schematic of the visible light source device using a nanocluster film deposited on a semiconductor device (LED) to control emission. The LED structure consists of a GaN buffer layer 101 (approximately 10–30 nm thick) grown on a substrate 102, such as sapphire or GaN substrates, onto which is grown a layer 103 of GaN, a layer 104 of n-$Al_{0.2}Ga_{0.8}$N:Si used as barrier layer, multiple GaN quantum wells 105 separated by undoped $Al_{0.2}Ga_{0.8}$N barrier layers 106, a p-$Al_{0.2}Ga_{0.8}$N layer 107, a p-$Al_{0.1}Ga_{0.9}$N layer 108 to aid in current spreading and a p-GaN contact layer 109. The multiple GaN quantum wells 105 separated by undoped $Al_{0.2}Ga_{0.8}$N barrier layers 106 form the semiconductor structure 100. In this semiconductor structure, the electrons are largely confined to the active GaN layers and the confinement is strong enough that the effective bandgap of said layers increases. An analogous device with only a single quantum well can function in a similar manner. This particular device structure has been demonstrated to have ultraviolet emission in the 350–360 nm region.

Ohmic contact can be made using standard techniques and electrical injection used to emit blue to UV light, making these LED structures optimal as optical pumping sources for nanocluster films. The nanocluster film 110 is deposited on the substrate on the side opposite the GaN layer. This deposition on the substrate side is appropriate for bottom-emitting "flip-chip" LEDs and is advantageous because it allows for deposition and patterning of the nanocluster film without interference from electrical contacts and bond wires. For more conventional top-emitting LEDs, one could alternatively coat the nanocluster materials on the sides and top of the chip, an approach that is commonly used with phosphor coated LEDs. The GaN LED emission is suitable for optical pumping, since the nanoclusters generally absorb light in the range of 600 nm to 200 nm. Using this design, only a single GaN-based LED is required, but arrays of these devices can also be used. When a sapphire substrate is used, absorption of UV light is avoided.

In one embodiment, a sapphire substrate is utilized with a 3 $\mu$m n-type GaN layer doped with silicon atoms (n approximately equal to $2 \times 10^{18}$ cm$^{-3}$) grown on the substrate, with an intermediate low temperature GaN buffer layer. A 0.1 $\mu$m thick n-type $Al_{0.2}Ga_{0.8}$N:Si barrier layer (n approximately equal to $2 \times 10^{18}$ cm$^{-3}$) is then grown to form a first barrier layer against escape of electrons from the semiconductor structure. This is followed by four GaN quantum wells (approximately 30 Å undoped) separated by undoped $Al_{0.2}Ga_{0.8}$N barrier layers (approximately 70 Å), a 0.1 $\mu$m p-$Al_{0.2}Ga_{0.8}$N ([Mg] approximately equal to $1 \times 10^{20}$ cm$^{-3}$) layer. On top of these quantum well layers/barrier layers is grown a 0.1 $\mu$m p-$Al_{0.2}Ga_{0.8}$N ([Mg] approximately equal to $1 \times 10^{20}$ cm$^{-3}$) layer and then a 0.2 $\mu$m p-$Al_{0.1}Ga_{0.9}$N ([Mg] approximately equal to $1 \times 10^{20}$ cm$^{-3}$) layer, to help current spreading that is accomplished by substituting magnesium dopant atoms for silicon dopants. Then follows a p-GaN ([Mg] approximately equal to $1 \times 10^{20}$ cm$^{-3}$, p approximately equal to $1 \times 10^{17}$ cm$^{-3}$) contact layer a 0.1 $\mu$m thick. A nanocluster solution, prepared as described previously, was deposited, evaporated, or spray coated onto the sapphire substrate surface opposite the GaN layer as a film.

Figure 7:
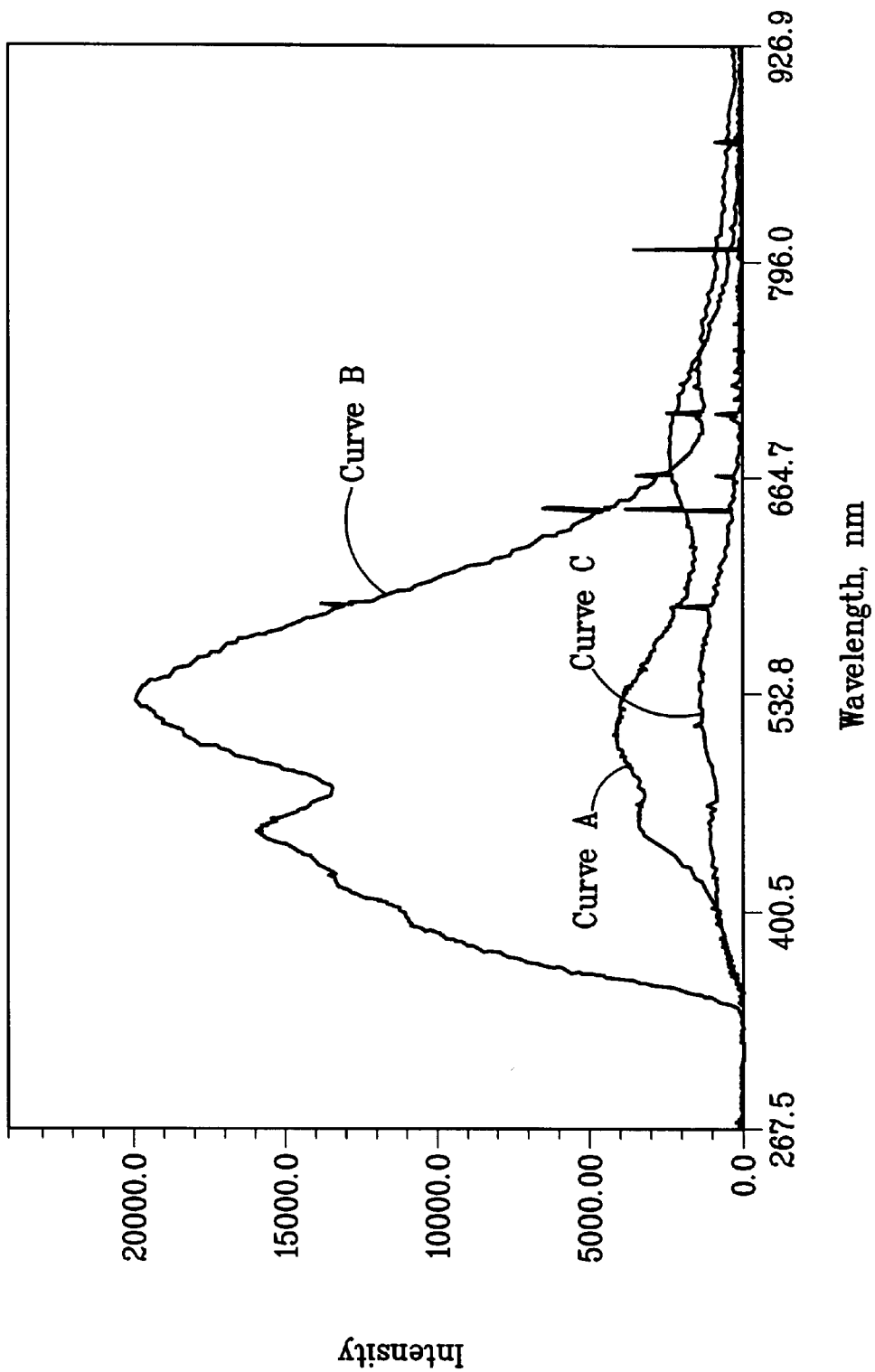
FIG. 7 shows luminescence characteristics of a $MoS_2$ nanocluster film excited by a 325 nm HeCd laser.

In one embodiment, a $MoS_2$ nanocluster solution was prepared and deposited as a film on a substrate. The substrate itself had luminescence as depicted by Curve A in FIG. 7 when excited by a 325 nm HeCd laser. Curves B and C represent the luminescence of the $MoS_2$ nanocluster film excited at 325 nm with intensities of 0.1 mW and 10 mW, respectively. Both curves show broadband emission from about 350 nm to 675 nm, which includes most of the visible spectrum.

The invention described herein is not intended to be restricted to the specific implementations described, but should include such structures and designs as would be obvious to one skilled in the art. In particular, any layers described as made of GaN or $Al_{0.2}Ga_{0.8}$N can be made from any suitable alloy in the AlGaInN system. Similarly, many approaches can be made to insuring that ohmic contact is made to the n-type and p-type semiconductor layers and all such structures and procedures are intended to be included in the present invention. Additionally, although the use of a sapphire substrate is preferred for some applications, other substrate materials, such as GaN and SiC materials, on which single crystal AlGaInN layers can be grown can also be used to implement the present invention.

We claim:

1. A visible light source device, comprising:
   a substrate layer comprising a top and bottom,
   a GaN buffer layer grown on the top of said substrate layer,
   a GaN layer grown on said GaN buffer layer,
   a n-$Al_{0.2}Ga_{0.8}$N layer grown on said GaN layer,
   a semiconductor quantum well structure grown on said n-$Al_{0.2}Ga_{0.8}$N layer,
   a p-$Al_{0.2}Ga_{0.8}$N layer grown on said semiconductor quantum well structure,
   a p-$Al_{0.1}Ga_{0.9}$N layer grown on said p-$Al_{0.2}Ga_{0.8}$N layer,
   a p-GaN contact layer; and
   a nanocluster film having strong absorption in the ultraviolet wavelength range and strong emission in the visible wavelength range deposited on the bottom of said substrate layer.

2. The visible light source device of claim 1 wherein said nanocluster film comprises nanocluster particles of size greater than approximately 2 nm in diameter and less than approximately 15 nm in diameter.

3. The visible light source device of claim 2 wherein said nanocluster particles comprise a material selected from $MoS_2$, $MoSe_2$, $WS_2$, $WSe_2$, CdS, CdSe, ZnS, and ZnSe.

4. The visible light source device of claim 1 wherein said nanocluster film has an absorption wavelength greater than approximately 300 nm.

5. The visible light source device of claim 4 wherein said nanocluster film has an absorption wavelength less than approximately 650 nm.

6. The visible light source device of claim 1 wherein said semiconductor quantum well structure comprises multiple alternating layers of a GaN material layer and a $Al_{0.2}Ga_{0.8}$N material layer.

7. The visible light source device of claim 6 wherein said GaN material layer is approximately 30 Angstroms in thickness.

8. The visible light source device of claim 6 wherein said $Al_{0.2}Ga_{0.8}N$ material layer is approximately 70 Angstroms in thickness.

9. The visible light source device of claim 7 wherein indium is added into said GaN material layer.

10. The visible light source device of claim 1 wherein said substrate comprises a sapphire material.

11. The visible light source device of claim 1 further comprising a first electrical contact which makes Ohmic contact to said $p-Al_{0.2}Ga_{0.8}N$ layer and a second electric contact which makes Ohmic contact to said $n-Al_{0.2}Ga_{0.8}N$ layer.

12. The visible light source device of claim 11 wherein said $p-Al_{0.1}Ga_{0.9}N$ layer and said $p-Al_{0.2}Ga_{0.8}N$ layer are doped with magnesium atoms.

13. The visible light source device of claim 1 wherein said GaN layer is approximately 3 microns in thickness.

14. The visible light source device of claim 1 wherein said $n-Al_{0.2}Ga_{0.8}N$ layer is approximately 0.1 microns in thickness.

15. The visible light source device of claim 1 wherein said $p-Al_{0.2}Ga_{0.8}N$ layer is approximately 0.1 microns in thickness.

16. The visible light source device of claim 1 wherein said $p-Al_{0.1}Ga_{0.9}N$ layer is approximately 0.2 microns in thickness.

17. The visible light source device of claim 1 wherein said nanocluster film has a thickness less than approximately 1 micron.

18. The visible light source device of claim 2 wherein said nanocluster particles comprise $MoS_2$ with a diameter greater than approximately 3 nm and less than approximately 5 nm to produce a broadband white source.

19. The visible light source device of claim 3 wherein said nanocluster particles additionally comprise Au.

* * * * *